US009887272B2

(12) United States Patent
Oxland et al.

(10) Patent No.: US 9,887,272 B2
(45) Date of Patent: Feb. 6, 2018

(54) METHOD FOR FORMING COUNTERDOPED SEMICONDUCTOR DEVICE COMPRISING FIRST EPITAXIAL LAYER AND SECOND EPITAXIAL LAYER FORMED OVER FIRST EPITAXIAL LAYER HAVING CONDUCTIVITY TYPE DIFFERENT THAN SECOND EPITAXIAL LAYER

(71) Applicant: Taiwan Semiconductor Manufacturing Company Limited, Hsin-Chu (TW)

(72) Inventors: Richard Kenneth Oxland, Brussels (BE); Martin Christopher Holland, Bertem (BE); Krishna Kumar Bhuwalka, Asansol (IN)

(73) Assignee: TAIWAN SEMICONDUCTOR MANUFACTURING COMPANY LIMITED (TW)

( * ) Notice: Subject to any disclaimer, the term of this patent is extended or adjusted under 35 U.S.C. 154(b) by 0 days.

(21) Appl. No.: 14/983,722

(22) Filed: Dec. 30, 2015

(65) Prior Publication Data
US 2016/0118475 A1 Apr. 28, 2016

Related U.S. Application Data

(62) Division of application No. 14/013,310, filed on Aug. 29, 2013, now Pat. No. 9,231,102.

(51) Int. Cl.
*H01L 29/10* (2006.01)
*H01L 21/306* (2006.01)
(Continued)

(52) U.S. Cl.
CPC .... *H01L 29/66537* (2013.01); *H01L 21/3065* (2013.01); *H01L 29/1045* (2013.01);
(Continued)

(58) Field of Classification Search
CPC ............ H01L 21/3065; H01L 29/1029; H01L 29/1045
See application file for complete search history.

(56) References Cited

U.S. PATENT DOCUMENTS

| 5,364,807 A | 11/1994 | Hwang |
| 6,214,679 B1 * | 4/2001 | Murthy ............ H01L 29/41783 257/E21.165 |

(Continued)

FOREIGN PATENT DOCUMENTS

TW I298948 7/2008

OTHER PUBLICATIONS

Corresponding Taiwan application, Taiwan Office action dated Nov. 23, 2015, 6 pages.

*Primary Examiner* — Thanh V Pham
(74) *Attorney, Agent, or Firm* — Cooper Legal Group, LLC

(57) ABSTRACT

A semiconductor device includes a first type region including a first conductivity type. The semiconductor device includes a second type region including a second conductivity type. The semiconductor device includes a third type region including a third conductivity type that is opposite the first conductivity type, the third type region covering the first type region. The semiconductor device includes a fourth type region including a fourth conductivity type that is opposite the second conductivity type, the fourth type region covering the second type region. The semiconductor device includes a channel region extending between the third type region and the fourth type region.

17 Claims, 17 Drawing Sheets

(51) Int. Cl.
    *H01L 29/66*    (2006.01)
    *H01L 29/78*    (2006.01)
    *H01L 21/3065*  (2006.01)

(52) U.S. Cl.
    CPC .... *H01L 29/1083* (2013.01); *H01L 29/66492* (2013.01); *H01L 29/66545* (2013.01); *H01L 29/66628* (2013.01); *H01L 29/66636* (2013.01); *H01L 29/66659* (2013.01); *H01L 29/7816* (2013.01)

(56) References Cited

U.S. PATENT DOCUMENTS

| | | | |
|---|---|---|---|
| 6,274,894 B1 * | 8/2001 | Wieczorek | H01L 29/0847 257/192 |
| 2006/0071278 A1 | 4/2006 | Takao | |

* cited by examiner

METHOD FOR FORMING COUNTERDOPED SEMICONDUCTOR DEVICE COMPRISING FIRST EPITAXIAL LAYER AND SECOND EPITAXIAL LAYER FORMED OVER FIRST EPITAXIAL LAYER HAVING CONDUCTIVITY TYPE DIFFERENT THAN SECOND EPITAXIAL LAYER

RELATED APPLICATION

This application is a divisional of and claims priority to U.S. patent application Ser. No. 14/013,310, titled "COUNTERDOPED SEMICONDUCTOR DEVICE" and filed on Aug. 29, 2013, which is incorporated herein by reference.

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques, and resulting structures, for forming a semiconductor device are provided herein.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
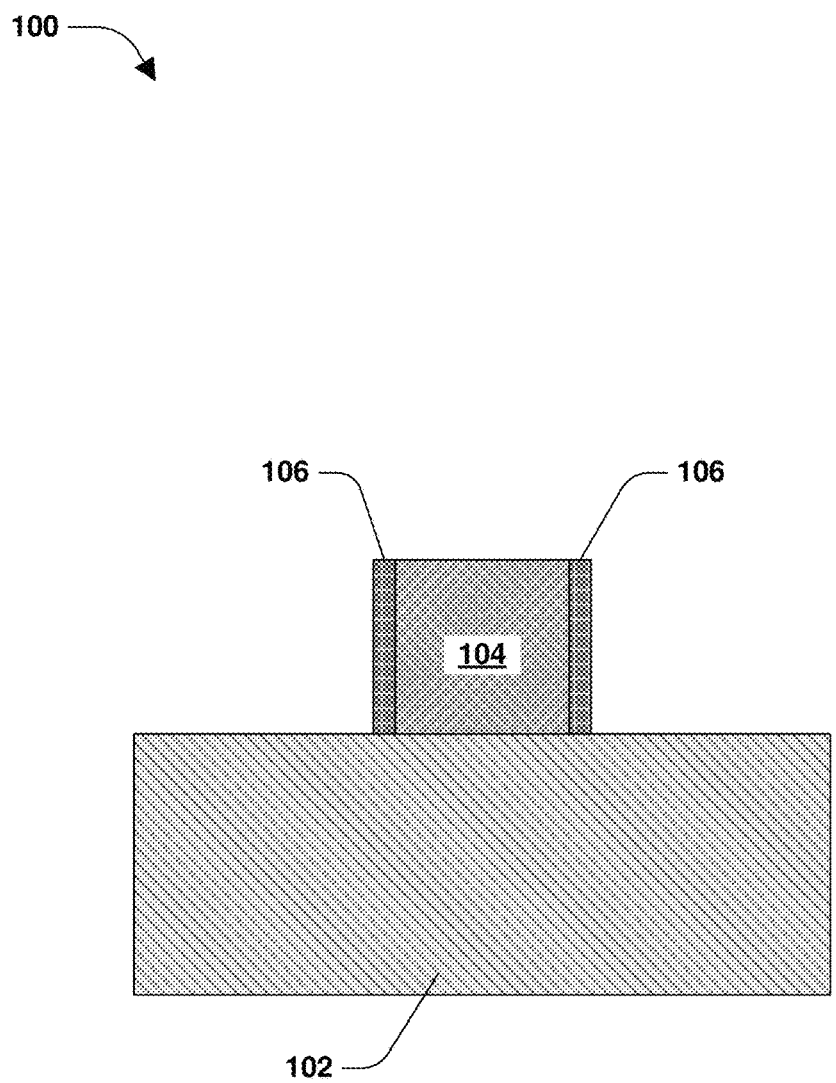
FIG. 1 illustrates a portion of a semiconductor device, according to an embodiment.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor device and resulting structures formed thereby are provided herein.

FIG. 1 is a sectional view illustrating a portion of a semiconductor device 100 according to some embodiments. In an embodiment, the semiconductor device 100 comprises a substrate region 102. The substrate region 102 comprises any number of materials, such as, for example, silicon, polysilicon, germanium, etc., alone or in combination. According to some embodiments, the substrate region 102 comprises an epitaxial layer, a silicon-on-insulator (SOI) structure, etc. According to some embodiments, the substrate region 102 corresponds to a wafer or a die formed from a wafer.

In an embodiment, a dummy gate 104 is formed over the substrate region 102. In some embodiments, the dummy gate 104 comprises silicon, polysilicon, other semiconductor materials, etc. The dummy gate 104 is formed in any number of ways, such as by deposition and patterning, for example. According to some embodiments, spacers 106 are formed around the dummy gate 104. In some embodiments, the spacers 106 comprise a dielectric material, such as nitride, oxide, etc., alone or in combination. The spacers 106 are formed in any number of ways, such as by deposition and patterning, for example.

Figure 2:
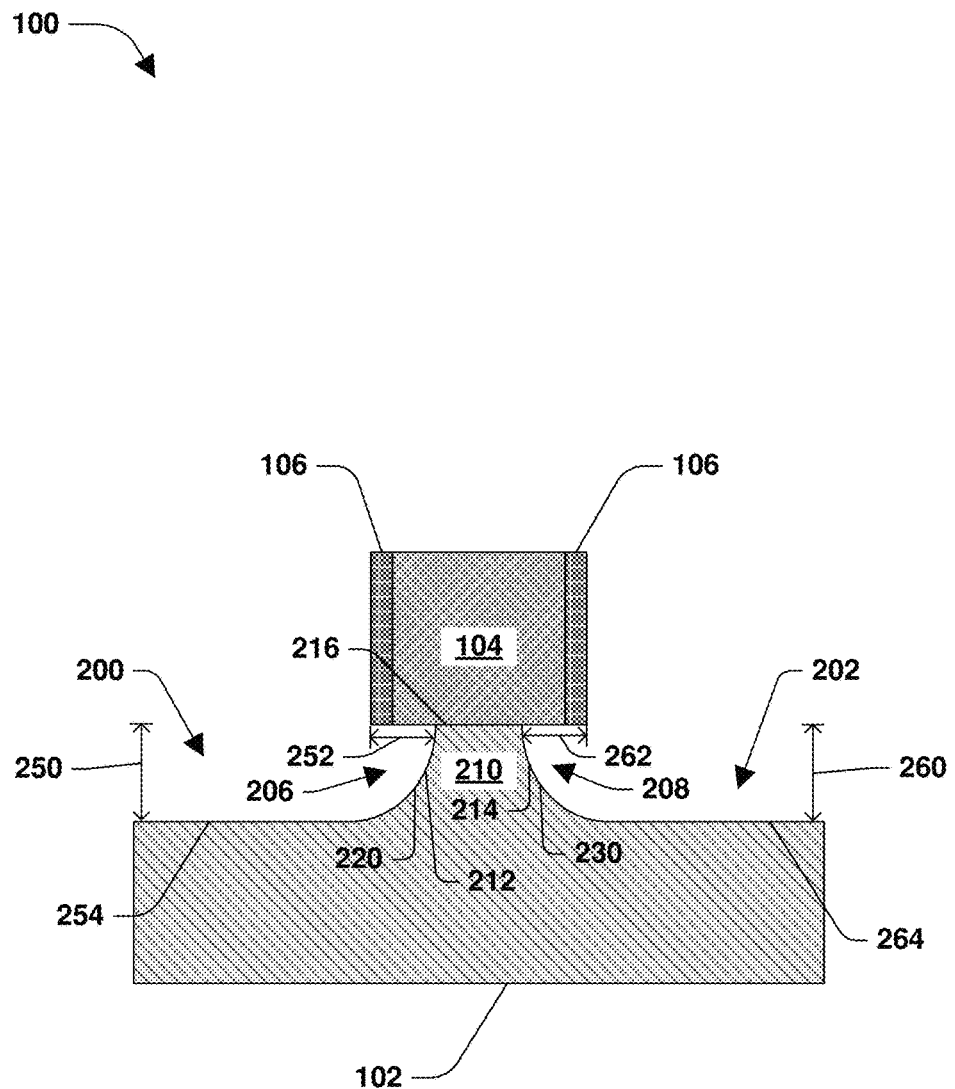
FIG. 2 illustrates a portion of a semiconductor device, according to an embodiment.

Turning to FIG. 2, in an embodiment, a first recess 200 and a second recess 202 are formed in the substrate region 102. In some embodiments, the first recess 200 and second recess 202 are formed by isotropic etch, anisotropic etch, wet etch, dry etch, lateral etch, etc. In some embodiments, the dummy gate 104 and the spacers 106 are masked while the substrate region 102 is etched to form the first recess 200 and second recess 202. According to some embodiments, a first end 206 of the first recess 200 is formed at least partially under the dummy gate 104 and spacer 106. According to some embodiments, a first end 208 of the second recess 202 is formed at least partially under the dummy gate 104 and the spacer 106.

In an embodiment, the first recess 200 and second recess 202 define a channel region 210. In some embodiments, the first recess 200 is positioned on a first side 212 of the channel region 210 while the second recess 202 is positioned on a second side 214 of the channel region 210. According to some embodiments, the channel region 210 comprises a top surface 216 that is disposed below the dummy gate 104.

In an embodiment, the first recess 200 includes a first depth 250 measured from a first surface 254 that defines a bottom of the first recess 200 to the top surface 216 of the channel region 210. In some embodiments, the first depth 250 is about 2 nanometers (nm) to about 20 nm. In some embodiments, the first recess 200 includes a first underlap distance 252 of the first recess 200 under the dummy gate 104 and spacer 106. In some embodiments, the first underlap distance 252 is about 2 nm to about 20 nm.

In an embodiment, the second recess 202 includes a second depth 260 measured from a second surface 264 that defines a bottom of the second recess 202 to the top surface 216 of the channel region 210. In some embodiments, the second depth 260 is about 2 nm to about 20 nm. In some embodiments, the second recess 202 includes a second underlap distance 262 of the second recess 202 under the dummy gate 104 and spacer 106. In some embodiments, the second underlap distance 262 is about about 2 nm to about 20 nm.

In an embodiment, the channel region 210 comprises a first non-linear surface 220 on the first side 212 of the channel region 210. In some embodiments, the first non-linear surface 220 comprises a {110} surface crystal orientation. In an embodiment, the channel region 210 comprises a second non-linear surface 230 on the second side 214 of the channel region 210. In some embodiments, the second non-linear surface 230 comprises a {110} surface crystal orientation.

Figure 3:
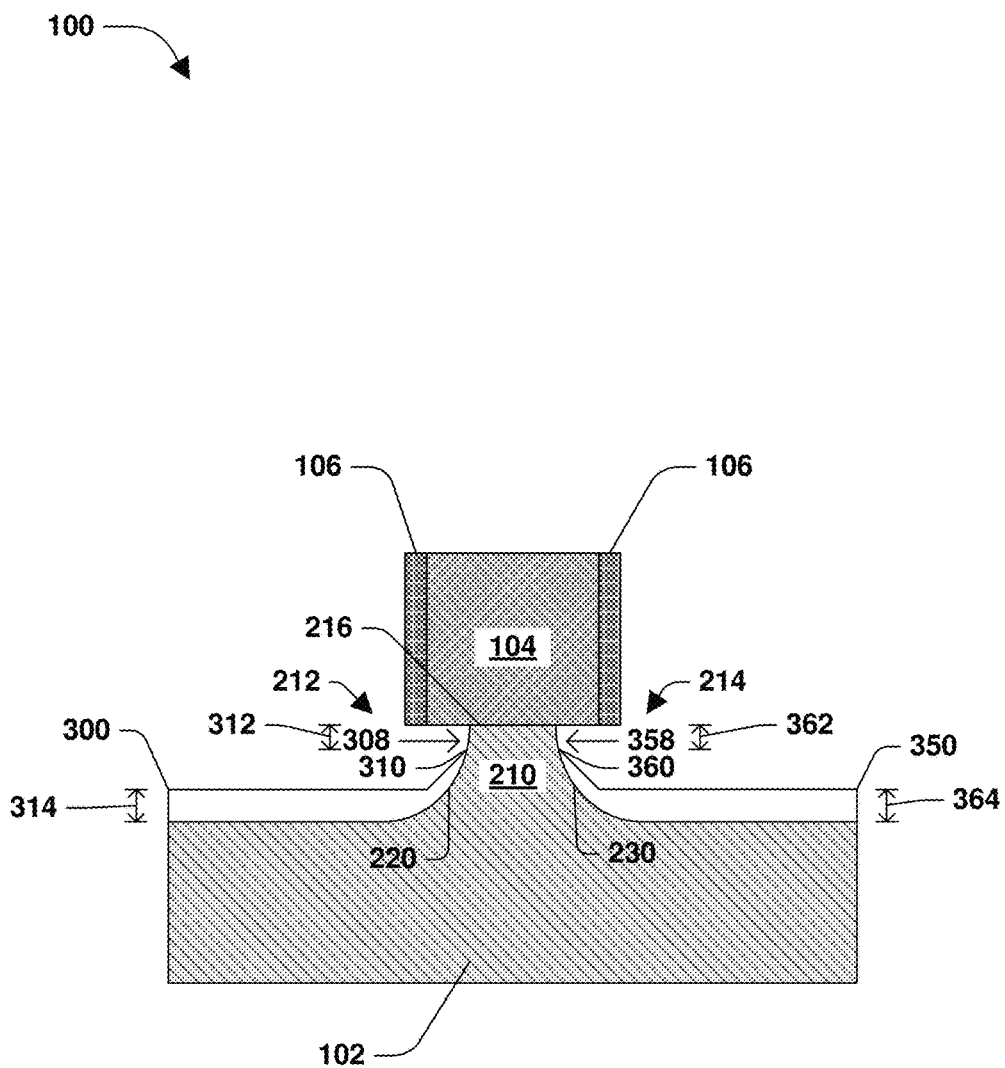
FIG. 3 illustrates forming a first type region and a second type region associated with forming a semiconductor device, according to an embodiment.

Turning to FIG. 3, in an embodiment, a first type region 300 is formed over the substrate region 102 at least partially within the first recess 200. In some embodiments, the first type region 300 is disposed on the first side 212 of the channel region 210. The first type region 300 is formed in any number of ways, such as by deposition, epitaxial growth, etc., for example. In some embodiments, the first type region 300 is doped during the epitaxial growth process. In some embodiments, the first type region 300 is doped after the epitaxial growth process. In some embodiments, the first type region 300 is doped during and after the epitaxial growth process. In some embodiments, the first type region 300 comprises a first conductivity type. In some embodiments, the first conductivity type of the first type region 300 comprises a p-type material. In some embodiments, the first conductivity type of the first type region 300 comprises an n-type material.

In an embodiment, the first type region 300 is in contact with the first non-linear surface 220 of the channel region 210. In some embodiments, the first type region 300 covers less than all of the first non-linear surface 220. In some embodiments, a first uncovered portion 308 of the first non-linear surface 220 is not covered by the first type region 300. According to some embodiments, a first type region end 310 of the first type region 300 is separated a first distance 312 from the top surface 216 of the channel region 210. In some embodiments, the first distance 312 is between about 0 nanometers (nm) to about 10 nm. In some embodiments, the first type region 300 comprises a first type region thickness 314 between about 2 nm to about 5 nm.

In an embodiment, a second type region 350 is formed over the substrate region 102 at least partially within the second recess 202. In some embodiments, the second type region 350 is disposed on the second side 214 of the channel region 210. The second type region 350 is formed in any number of ways, such as by deposition, epitaxial growth, etc., for example. In some embodiments, the second type region 350 is doped during the epitaxial growth process. In some embodiments, the second type region 350 is doped after the epitaxial growth process. In some embodiments, the second type region 350 is doped during and after the epitaxial growth process. In some embodiments, the second type region 350 comprises a second conductivity type. In some embodiments, the second conductivity type of the second type region 350 comprises a p-type material. In some embodiments, the second conductivity type of the second type region 350 comprises an n-type material.

In an embodiment, the second type region 350 is in contact with the second non-linear surface 230 of the channel region 210. In some embodiments, the second type region 350 covers less than all of the second non-linear surface 230. In some embodiments, a second uncovered portion 358 of the second non-linear surface 230 is not covered by the second type region 350. According to some embodiments, a second type region end 360 of the second type region 350 is separated a second distance 362 from the top surface 216 of the channel region 210. In some embodiments, the second distance 362 is between about 0 nm to about 10 nm. In some embodiments, the second type region 350 comprises a second type region thickness 364 between about 2 nm to about 5 nm.

Figure 4:
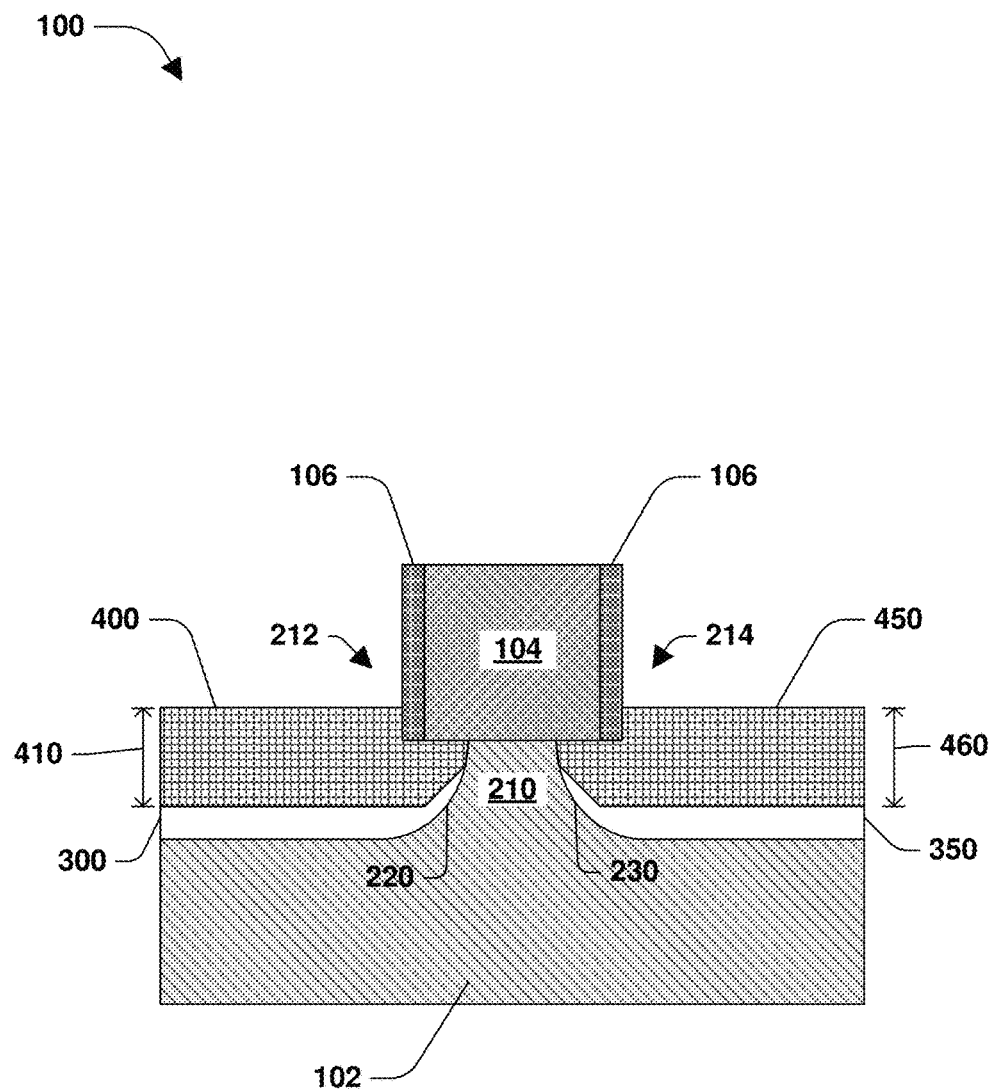
FIG. 4 illustrates forming a third type region and a fourth type region associated with forming a semiconductor device, according to an embodiment.

Turning to FIG. 4, in an embodiment, a third type region 400 is formed covering the first type region 300. In some embodiments, the third type region 400 is disposed on the first side 212 of the channel region 210. The third type region 400 is formed in any number of ways, such as by deposition, epitaxial growth, etc., for example. In some embodiments, the third type region 400 is doped during the epitaxial growth process. In some embodiments, the third type region 400 is doped after the epitaxial growth process. In some embodiments, the third type region 400 doped during and after the epitaxial growth process. In some embodiments, the third type region 400 is in contact with the first non-linear surface 220 of the channel region 210. In some embodiments, the third type region 400 comprises a third conductivity type. In some embodiments, the third conductivity type of the third type region 400 comprises a p-type material. In some embodiments, the third conductivity type of the third type region 400 comprises an n-type material. In an embodiment, the third type region 400 comprises a source region. In an embodiment, the third type region 400 comprises a drain region.

According to some embodiments, the third conductivity type of the third type region 400 is opposite the first conductivity type. In some embodiments, the first conductivity type of the first type region 300 comprises a p-type material and the third conductivity type of the third type region 400 comprises an n-type material. In some embodiments, the first conductivity type of the first type region 300 comprises an n-type material and the third conductivity type of the third type region 400 comprises a p-type material. In some embodiments, the third type region 400 comprises a third type region thickness 410 between about 5 nm to about 50 nm.

In an embodiment, a fourth type region 450 is formed covering the second type region 350. In some embodiments, the fourth type region 450 is disposed on the second side 214 of the channel region 210 such that the channel region 210 extends between the third type region 400 and the fourth type region 450. The fourth type region 450 is formed in any number of ways, such as by deposition, epitaxial growth, etc., for example. In some embodiments, the fourth type region 450 is doped during the epitaxial growth process. In some embodiments, the fourth type region 450 is doped after the epitaxial growth process. In some embodiments, the fourth type region 450 is doped during and after the epitaxial growth process. In some embodiments, the fourth type region 450 is in contact with the second non-linear surface 230 of the channel region 210. In some embodiments, the fourth type region 450 comprises a fourth conductivity type. In some embodiments, the fourth conductivity type of the fourth type region 450 comprises a p-type material. In some embodiments, the fourth conductivity type of the fourth type region 450 comprises an n-type material. In an embodiment, the fourth type region 450 comprises a source region. In an embodiment, the fourth type region 450 comprises a drain region.

According to some embodiments, the fourth conductivity type of the fourth type region 450 is opposite the second conductivity type. In some embodiments, the second conductivity type of the second type region 350 comprises a p-type material and the fourth conductivity type of the fourth type region 450 comprises an n-type material. In some embodiments, the second conductivity type of the second type region 350 comprises an n-type material and the fourth conductivity type of the fourth type region 450 comprises a p-type material. In some embodiments, the fourth type region 450 comprises a fourth type region thickness 460 between about 5 nm to about 50 nm.

Figure 5:
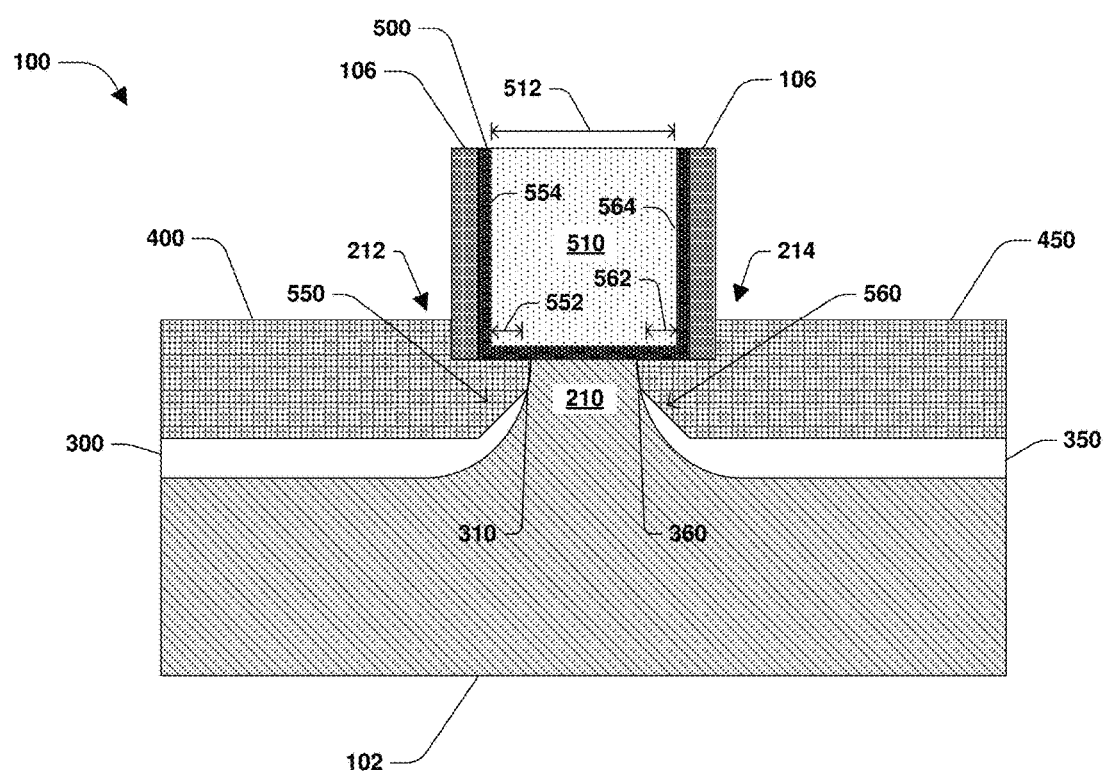
FIG. 5 illustrates a semiconductor device, according to an embodiment.

Turning to FIG. 5, in an embodiment, the dummy gate 104 is removed, such as by etching. In some embodiments, a gate dielectric 500 is formed over the channel region 210 and portions of the third type region 400 and fourth type region 450. According to some embodiments, the gate dielectric 500 is also formed on spacers 106. The gate dielectric 500 is formed in any number of ways, such as by atomic layer deposition (ALD), chemical vapor deposition (CVD), physical vapor deposition (PVD), or other suitable techniques, for example. The gate dielectric 500 comprises any number of materials, including, in some embodiments, high-k dielectric materials, oxides, silicon dioxide, etc., alone or in combination. According to some embodiments, the gate dielectric 500 comprises a standard dielectric material with a medium dielectric constant, such as $SiO_2$.

According to some embodiments, a gate electrode 510 is formed above the gate dielectric 500. The gate electrode 510 is formed in any number of ways, such as by deposition, epitaxial growth, etc., for example. In some embodiments, the gate electrode 510 includes a conductive material, such as aluminum, copper, etc., alone or in combination. In an embodiment, the gate electrode 510 is disposed above the channel region 210 and portions of the third type region 400 and fourth type region 450. In some embodiments, the gate electrode 510 comprises a gate length 512 of about 5 nm to about 100 nm. According to some embodiments, in a gate first process, the gate dielectric 500 and gate electrode 510 are formed first, followed by the formation of at least one of the channel region 210, first type region 300, second type region 350, third type region 400, fourth type region 450, etc.

In some embodiments, the gate electrode 510 at least partially overlaps the first type region 300. According to an embodiment, the first type region 300 comprises a first overlap portion 550 that is disposed under the gate electrode 510. In some embodiments, the first overlap portion 550 comprises a first overlap distance 552 measured from a first end 554 of the gate electrode 510 to the first type region end 310 of the first type region 300. According to some embodiments, the first overlap distance 552 is between about 0 nm to about 10 nm.

In some embodiments, the gate electrode 510 at least partially overlaps the second type region 350. According to an embodiment, the second type region 350 comprises a second overlap portion 560 that is disposed under the gate electrode 510. In some embodiments, the second overlap portion 560 comprises a second overlap distance 562 measured from a second end 564 of the gate electrode 510 to the second type region end 360 of the second type region 350. According to some embodiments, the second overlap distance 562 is between about 0 nm to about 10 nm.

Figure 6:
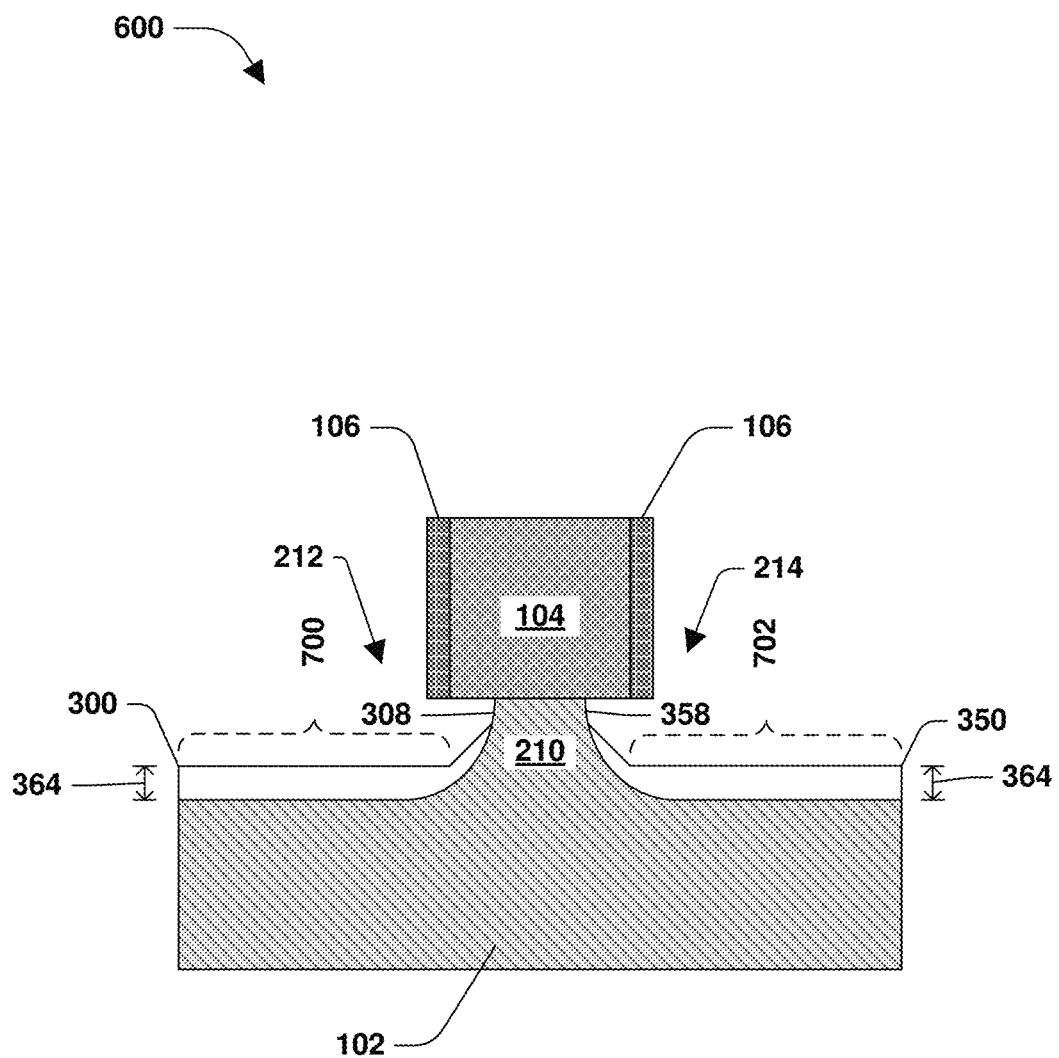
FIG. 6 illustrates a portion of a semiconductor device, according to an embodiment.

FIG. 6 illustrates an embodiment of a second semiconductor device 600 after the formation of the first type region 300 and second type region 350 following the embodiment illustrated in FIG. 3. According to some embodiments, the second semiconductor device 600 comprises the substrate region 102, dummy gate 104, spacers 106, channel region 210, etc.

Figure 7:
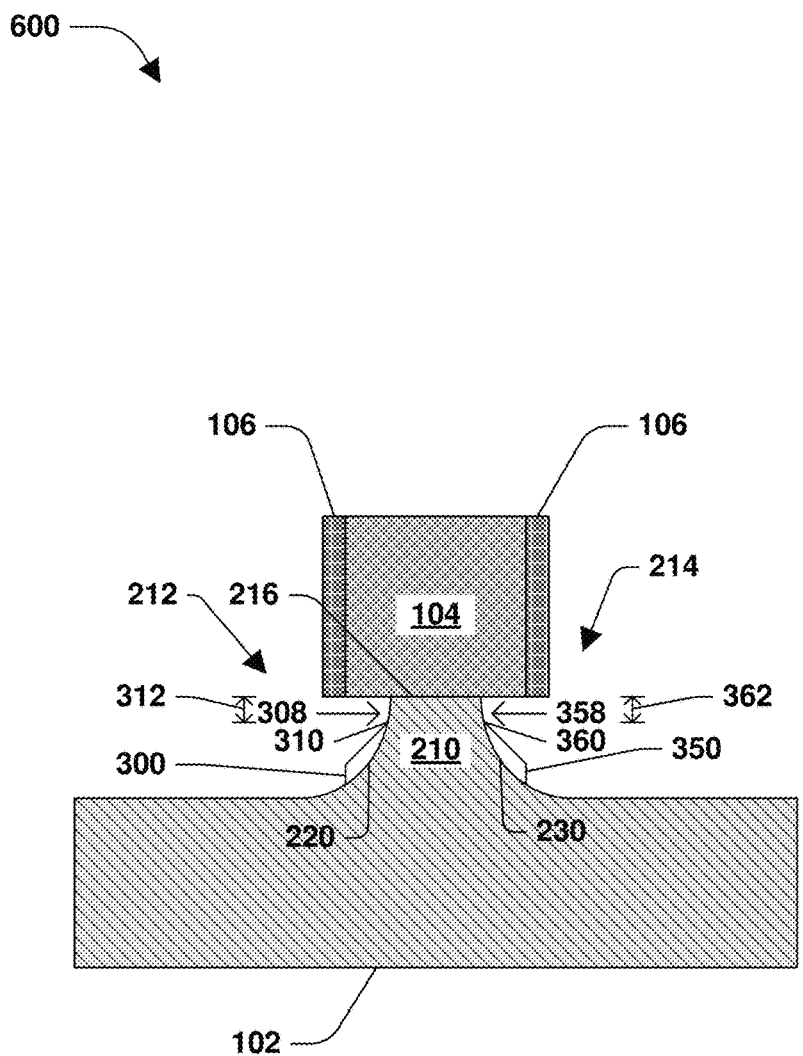
FIG. 7 forming a first type region and a second type region associated with forming a semiconductor device, according to an embodiment.

Turning to FIG. 7, in an embodiment, a first portion 700 (illustrated in FIG. 6) of the first type region 300 and a second portion 702 (illustrated in FIG. 6) of the second type region 350 are removed, such as by etching. In some embodiments, the first portion 700 and second portion 702 are removed by anisotropic etching, dry etching with argon, etc. According to some embodiments, the first portion 700 is located on the first side 212 of the channel region 210 and the second portion 702 is located on the second side 214 of the channel region 210. In an embodiment, some or all of the first portion 700 is located outside of and not underneath the dummy gate 104 or spacer 106. In an embodiment, some or all of the second portion 702 is located outside of and not underneath the dummy gate 104 or spacer 106. In some embodiments, after removal of the first portion 700, the remaining portion of the first type region 300 is located at least partially under the dummy gate 104 and spacer 106. In some embodiments, after removal of the second portion 702, the remaining portion of the second type region 350 is located at least partially under the dummy gate 104 and spacer 106.

In an embodiment, the first type region 300 is in contact with the first non-linear surface 220 of the channel region 210. In some embodiments, the first uncovered portion 308 of the first non-linear surface 220 is not covered by the first type region 300. According to some embodiments, the first type region end 310 of the first type region 300 is separated the first distance 312 from the top surface 216 of the channel region 210. In some embodiments, the first distance 312 is between about 0 nm to about 10 nm.

In an embodiment, the second type region 350 is in contact with the second non-linear surface 230 of the channel region 210. In some embodiments, the second uncovered portion 358 of the second non-linear surface 230 is not covered by the second type region 350. According to some embodiments, the second type region end 360 of the second type region 350 is separated the second distance 362 from the top surface 216 of the channel region 210. In some embodiments, the second distance 362 is between about 0 nm to about 10 nm.

Figure 8:
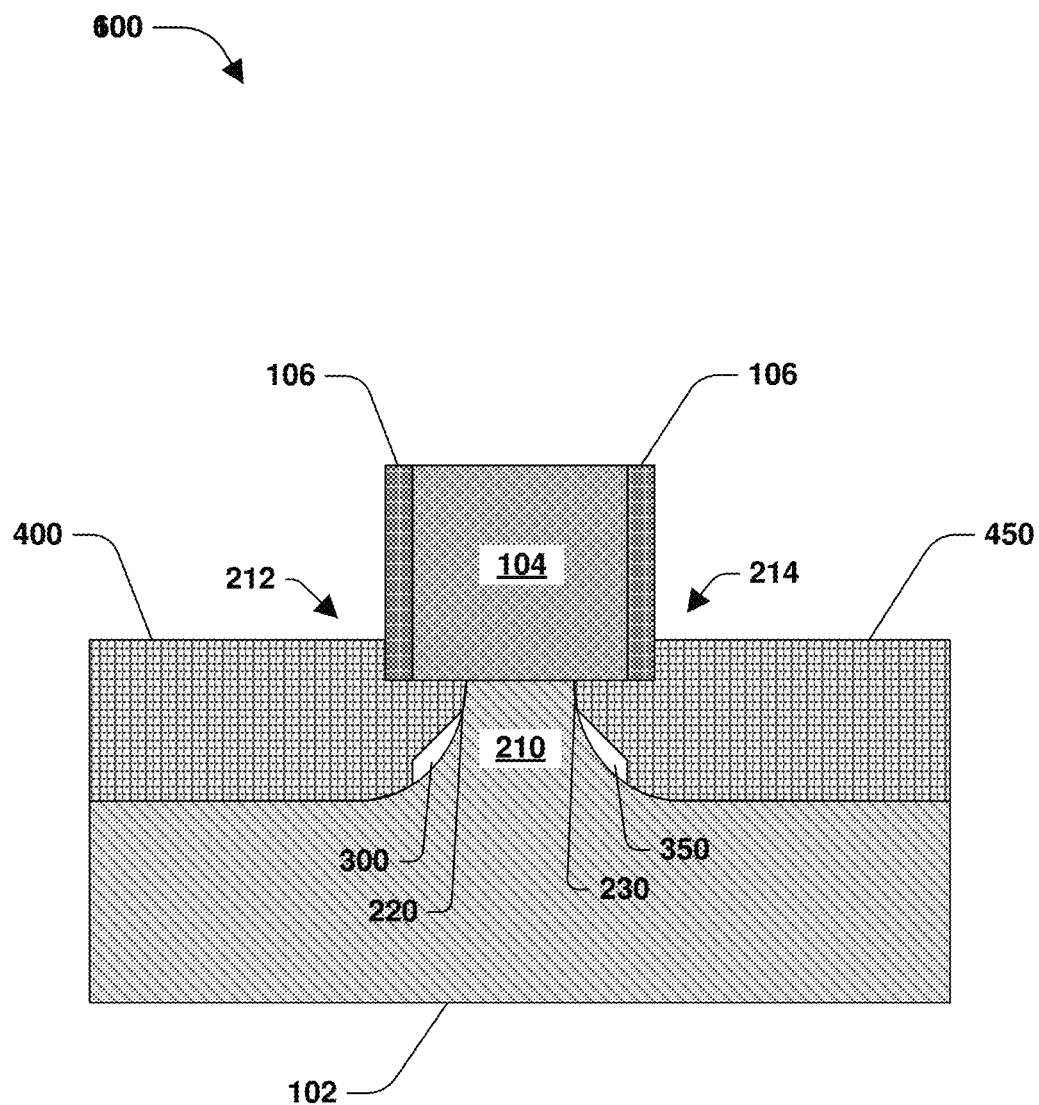
FIG. 8 illustrates forming a third type region and a fourth type region associated with forming a semiconductor device, according to an embodiment.

Turning to FIG. 8, in an embodiment, the third type region 400 is formed covering the first type region 300. In some embodiments, the third type region 400 is disposed on the first side 212 of the channel region 210. In an embodiment, the third type region 400 is formed covering the substrate region 102. In some embodiments, the third type region 400 is in contact with the first non-linear surface 220 of the channel region 210. According to some embodiments, the third conductivity type of the third type region 400 is opposite the first conductivity type.

In an embodiment, the fourth type region 450 is formed covering the second type region 350. In some embodiments, the fourth type region 450 is disposed on the second side 214 of the channel region 210 such that the channel region 210 extends between the third type region 400 and the fourth type region 450. In some embodiments, the fourth type region 450 is formed covering the substrate region 102. In some embodiments, the fourth type region 450 is in contact with the second non-linear surface 230 of the channel region 210. According to some embodiments, the fourth conductivity type of the fourth type region 450 is opposite the second conductivity type.

Figure 9:
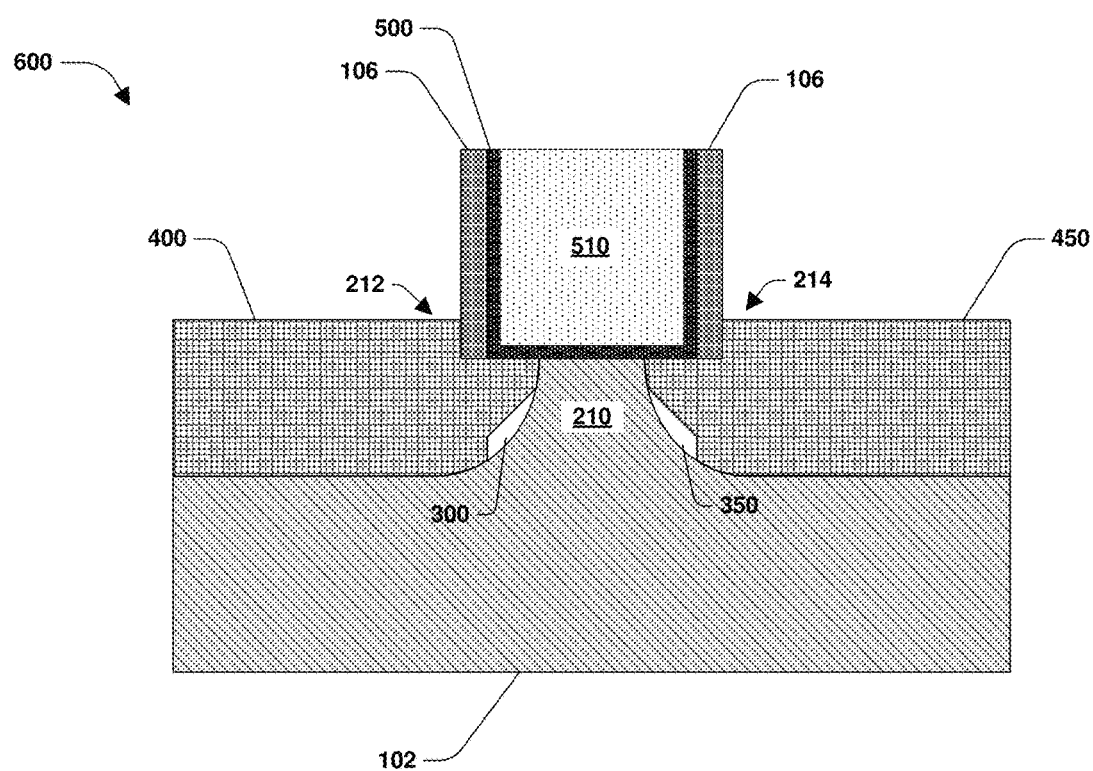
FIG. 9 illustrates a semiconductor device, according to an embodiment.

Turning to FIG. 9, in an embodiment, the dummy gate 104 is removed, such as by etching. In some embodiments, the gate dielectric 500 is formed over the channel region 210 and portions of the third type region 400 and fourth type region 450. According to some embodiments, the gate dielectric 500 is also formed on spacers 106. According to some embodiments, the gate electrode 510 is formed above the gate dielectric 500. In an embodiment, the gate electrode 510 is disposed above the channel region 210 and portions of the third type region 400 and fourth type region 450. According to some embodiments, in a gate first process, the gate dielectric 500 and gate electrode 510 are formed first, followed by the formation of at least one of the channel region 210, first type region 300, second type region 350, third type region 400, fourth type region 450, etc.

Figure 10:
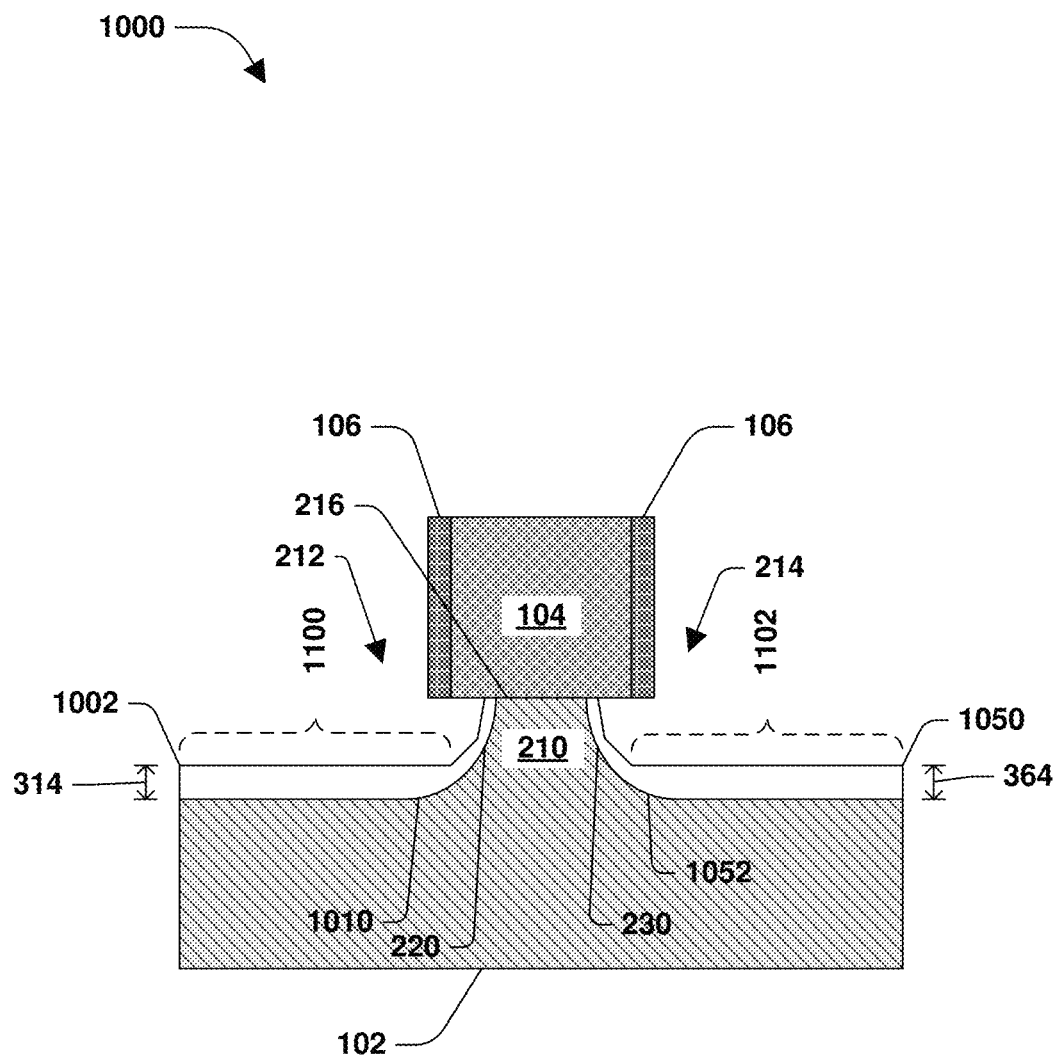
FIG. 10 illustrates a portion of a semiconductor device, according to an embodiment.

FIG. 10 illustrates an embodiment of a third semiconductor device 1000 after the formation of a first type region 1002 and second type region 1050 following the embodiment illustrated in FIG. 3. According to some embodiments, the third semiconductor device 1000 comprises the substrate region 102, dummy gate 104, spacers 106, channel region 210, etc.

In an embodiment, the first type region 1002 is formed over the substrate region 102 at least partially within the first recess 200 (illustrated in FIG. 2). In some embodiments, the first type region 1002 is disposed on the first side 212 of the channel region 210. The first type region 1002 is formed in any number of ways, such as by deposition, epitaxial growth, etc., for example. In some embodiments, the first type region 1002 is doped during the epitaxial growth process. In some embodiments, the first type region 1002 is doped after the epitaxial growth process. In some embodiments, the first type region 1002 is doped during and after the epitaxial growth process. In some embodiments, the first type region 1002 comprises the first conductivity type. In some embodiments, the first conductivity type of the first type region 1002 comprises a p-type material. In some embodiments, the first conductivity type of the first type region 1002 comprises an n-type material.

In an embodiment, the first type region 1002 is in contact with the first non-linear surface 220 of the channel region 210. In some embodiments, the first type region 1002 covers substantially all of the first non-linear surface 220. In some embodiments, the first type region 1002 is in contact with the first non-linear surface 220 from a bottom portion 1010 of the channel region 210 to the top surface 216 of the channel region 210. In some embodiments, the first type region 1002 comprises the first type region thickness 314 between about 2 nm to about 5 nm.

In an embodiment, the second type region 1050 is formed over the substrate region 102 at least partially within the second recess 202 (illustrated in FIG. 2). In some embodiments, the second type region 1050 is disposed on the second side 214 of the channel region 210. The second type region 1050 is formed in any number of ways, such as by deposition, epitaxial growth, etc., for example. In some embodiments, the second type region 1050 is doped during the epitaxial growth process. In some embodiments, the second type region 1050 is doped after the epitaxial growth process. In some embodiments, the second type region 1050 is doped during and after the epitaxial growth process. In some embodiments, the second type region 1050 comprises the second conductivity type. In some embodiments, the second conductivity type of the second type region 1050 comprises a p-type material. In some embodiments, the second conductivity type of the second type region 1050 comprises an n-type material.

In an embodiment, the second type region 1050 is in contact with the second non-linear surface 230 of the channel region 210. In some embodiments, the second type region 1050 covers substantially all of the second non-linear surface 230. In some embodiments, the second type region 1050 is in contact with the second non-linear surface 230 from a bottom portion 1052 of the channel region 210 to the top surface 216 of the channel region 210. In some embodiments, the second type region 1050 comprises the second type region thickness 364 between about 2 nm to about 5 nm.

Figure 11:
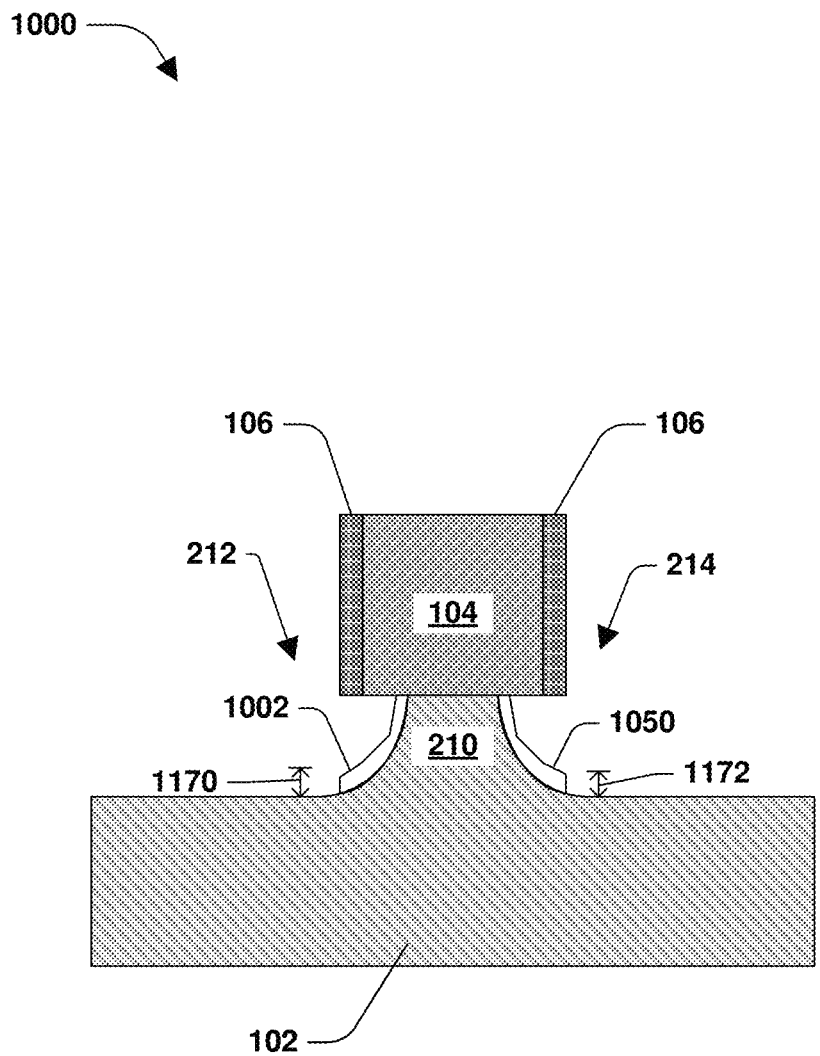
FIG. 11 illustrates forming a first type region and a second type region associated with forming a semiconductor device, according to an embodiment.

Turning to FIG. 11, in an embodiment, a first portion 1100 of the first type region 1002 (illustrated in FIG. 10) and a second portion 1102 (illustrated in FIG. 10) of the second type region 1050 are removed, such as by etching. In some embodiments, the first portion 1100 and second portion 1102 are removed by anisotropic etching, dry etching with argon, etc. According to some embodiments, the first portion 1100 is located on the first side 212 of the channel region 210 and the second portion 1102 is located on the second side 214 of the channel region 210. In an embodiment, some or all of the first portion 1100 is located outside of and not underneath the dummy gate 104 or spacer 106. In an embodiment, some or all of the second portion 1102 is located outside of and not underneath the dummy gate 104 or spacer 106.

According to some embodiments, after removal of the first portion 1100, the remaining portion of the first type region 1002 is located at least partially under the dummy gate 104 and spacer 106. In some embodiments, after removal of the second portion 1102, the remaining portion of the second type region 1050 is located at least partially under the dummy gate 104 and spacer 106. In some embodiments, the first type region 1002 comprises a first type region thickness 1170 between about 2 nm to about 5 nm. In some embodiments, the second type region 1050 comprises a second type region thickness 1172 between about 2 nm to about 5 nm.

Figure 12:
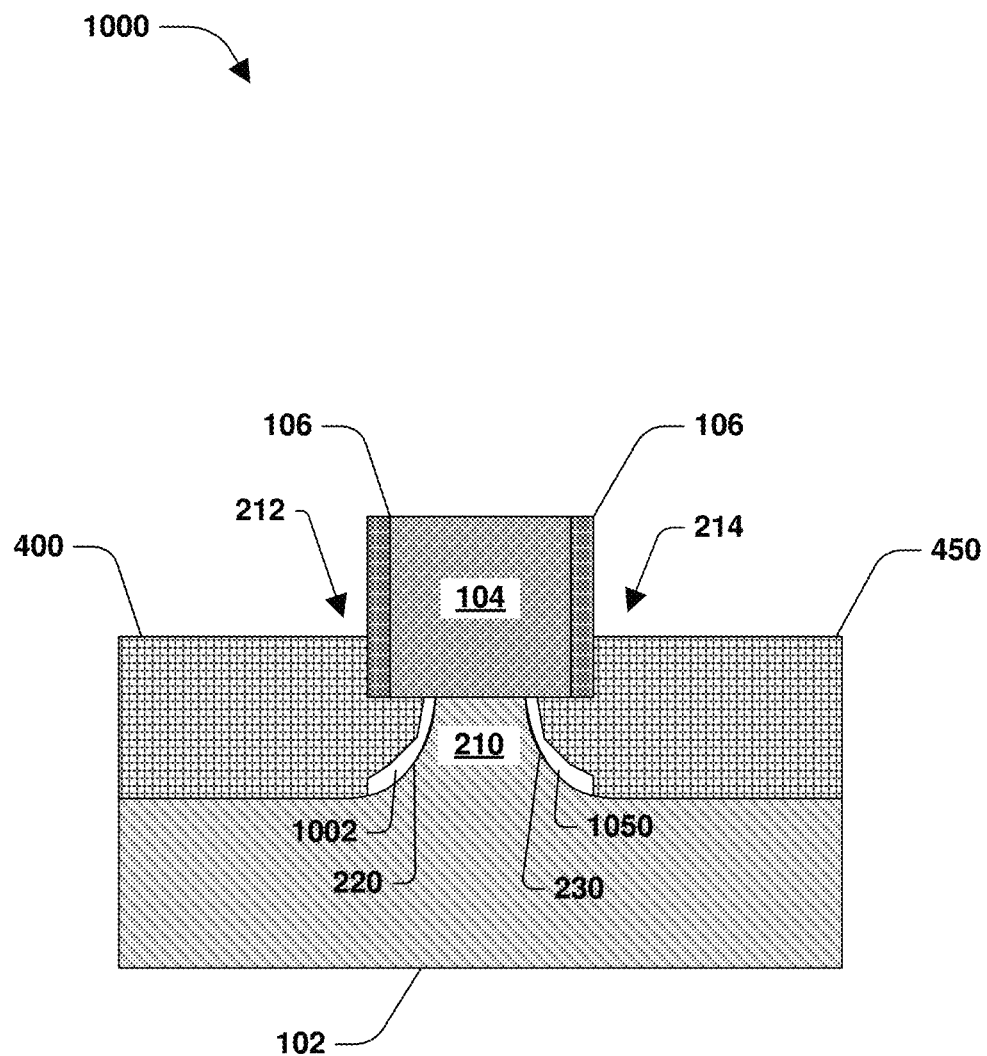
FIG. 12 illustrates forming a third type region and a fourth type region associated with forming a semiconductor device, according to an embodiment.

Turning to FIG. 12, in an embodiment, the third type region 400 is formed covering the first type region 1002. In some embodiments, the third type region 400 is disposed on the first side 212 of the channel region 210. In an embodiment, the third type region 400 is formed covering the substrate region 102. In some embodiments, the third type region 400 is not in contact with the first non-linear surface 220 of the channel region 210. According to some embodiments, the third conductivity type of the third type region 400 is opposite the first conductivity type.

In an embodiment, the fourth type region 450 is formed covering the second type region 1050. In some embodiments, the fourth type region 450 is disposed on the second side 214 of the channel region 210. In some embodiments, the fourth type region 450 is formed covering the substrate region 102. In some embodiments, the fourth type region 450 is not in contact with the second non-linear surface 230 of the channel region 210. According to some embodiments, the fourth conductivity type of the fourth type region 450 is opposite the second conductivity type. In some embodiments, such as where the first type region 1002 covers substantially all of the first non-linear surface 220 and the second type region 1050 covers substantially all of the second non-linear surface 230, the channel region 210 extends between the first type region 1002 and the second type region 1050. The channel region 210 nevertheless also extends between or is situated between the third type region 400 and the fourth type region 450.

Figure 13:
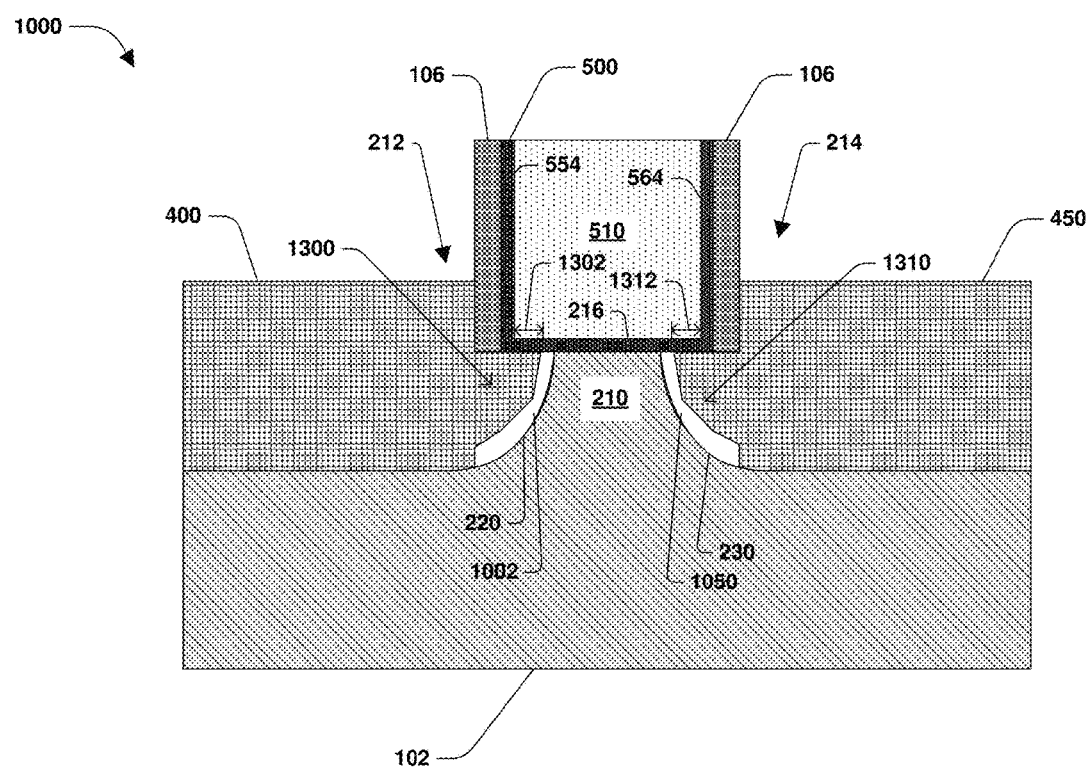
FIG. 13 illustrates a semiconductor device, according to an embodiment.

Turning to FIG. 13, in an embodiment, the dummy gate 104 is removed, such as by etching. In some embodiments, the gate dielectric 500 is formed over the channel region 210 and portions of the third type region 400 and fourth type region 450. According to some embodiments, the gate dielectric 500 is also formed on spacers 106. According to some embodiments, the gate electrode 510 is formed above the gate dielectric 500. In an embodiment, the gate electrode is disposed above the channel region 210 and portions of the first type region 1002, second type region 1050, third type region 400 and fourth type region 450. According to some embodiments, in a gate first process, the gate dielectric 500 and gate electrode 510 are formed first, followed by the formation of at least one of the channel region 210, first type region 1002, second type region 1050, third type region 400, fourth type region 450, etc.

In some embodiments, the gate electrode 510 at least partially overlaps the first type region 1002. According to an embodiment, the first type region 1002 comprises a first overlap portion 1300 that is disposed under the gate electrode 510. In some embodiments, the first overlap portion 1300 comprises a first overlap distance 1302 measured from the first end 554 of the gate electrode 510 to the first type region 1002 near the top surface 216 of the channel region 210. According to some embodiments, the first overlap distance 1302 is between about 0 nm to about 10 nm.

In some embodiments, the gate electrode 510 at least partially overlaps the second type region 1050. According to an embodiment, the second type region 1050 comprises a second overlap portion 1310 that is disposed under the gate electrode 510. In some embodiments, the second overlap portion 1310 comprises a second overlap distance 1312 measured from the second end 564 of the gate electrode 510 to the second type region 1050 near the top surface 216 of the channel region 210. According to some embodiments, the second overlap distance 1312 is between about 0 nm to about 10 nm.

Figure 14:
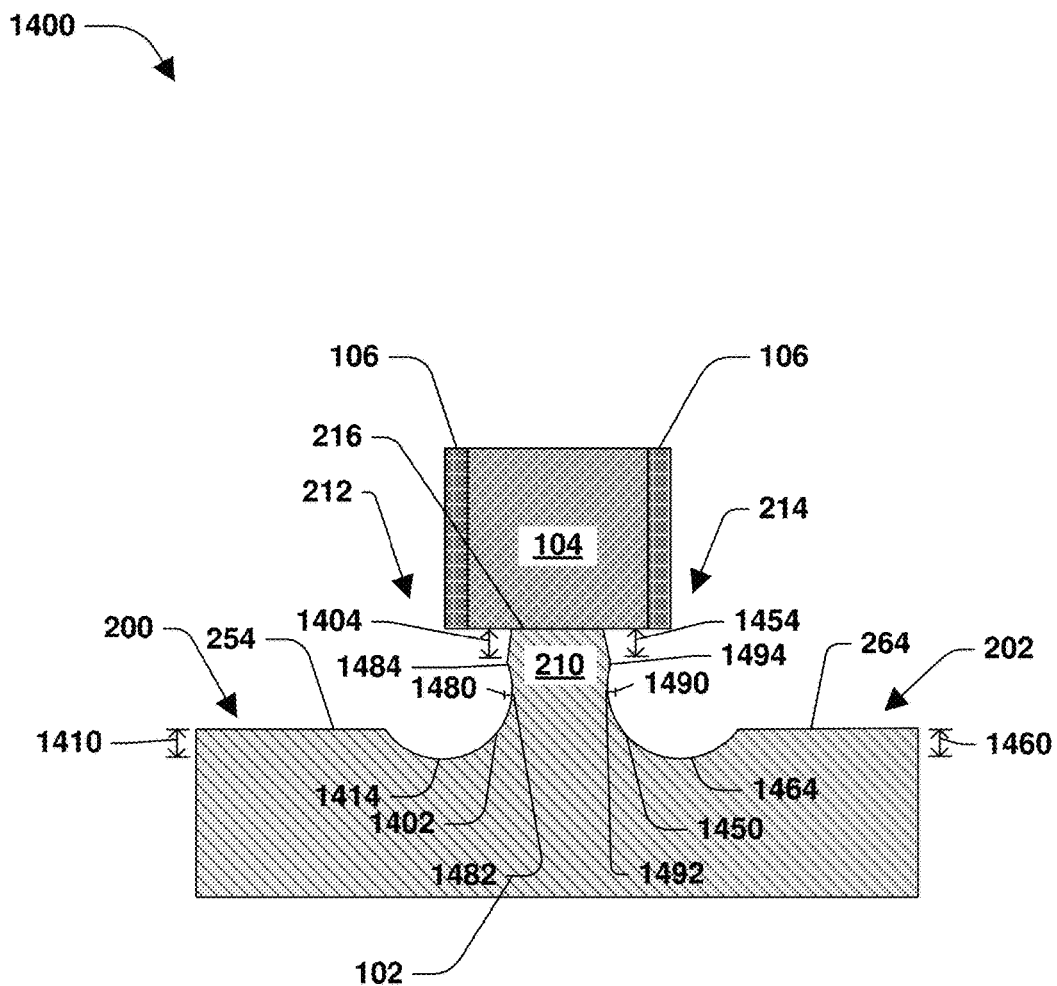
FIG. 14 illustrates a portion of a semiconductor device, according to an embodiment.

FIG. 14 illustrates an embodiment of a fourth semiconductor device 1400 after the formation of the first recess 200 and second recess 202 following the embodiment illustrated in FIG. 2. According to some embodiments, the fourth semiconductor device 1400 comprises the substrate region 102, dummy gate 104, spacers 106, first recess 200, second recess 202, channel region 210, etc.

In an embodiment, a first pocket 1402 and a second pocket 1450 are formed in the substrate region 102. In some embodiments, the first pocket 1402 and second pocket 1450 are formed by an isotropic etch, anisotropic etch, wet etch, dry etch, lateral etch, etc. According to some embodiments, the first pocket 1402 and second pocket 1450 are formed as part of a two step etch process, in which the first recess 200 and second recess 202 are etched first, followed by the first pocket 1402 and second pocket 1450 etched second. In some embodiments, the first pocket 1402 and second pocket 1450 are formed by a reactive ion etching at a temperature greater than 200° C. In some embodiments, the etch chemistry includes $SiCl_4$, $SF_6$, etc. In some embodiments, the dummy gate 104 and the spacers 106 are masked while the substrate region 102 is etched to form the first pocket 1402 and second pocket 1450.

In an embodiment, the first pocket 1402 is formed on the first side 212 of the channel region 210. In an embodiment, the first pocket 1402 is separated a first separating distance 1404 from the top surface 216 of the channel region 210. According to some embodiments, the first separating distance 1404 is between about 0 nm to about 10 nm. In some embodiments, the first pocket 1402 comprises a first pocket depth 1410 measured from the first surface 254 defining a bottom of the first recess 200 to a bottom portion 1414 of the first pocket 1402. In some embodiments, the first pocket depth 1410 is between about 0 nm to about 20 nm. In some embodiments, the first pocket 1402 comprises a first pocket length 1480 measured from a first pocket end 1482 to a top portion 1484 of the first pocket 1402. In some embodiments, the first pocket length 1480 is between about 0.5 nm to about 10 nm.

In an embodiment, the second pocket 1450 is formed on the second side 214 of the channel region 210. In an embodiment, the second pocket 1450 is separated a second separating distance 1454 from the top surface 216 of the channel region 210. According to some embodiments, the second separating distance 1454 is between about 0 nm to about 10 nm. In some embodiments, the second pocket 1450 comprises a second pocket depth 1460 measured from the second surface 264 defining a bottom of the second recess 202 to a bottom portion 1464 of the second pocket 1450. In some embodiments, the second pocket depth 1460 is between about 0 nm to about 20 nm. In some embodiments, the second pocket 1450 comprises a second pocket length 1490 measured from a second pocket end 1492 to a top portion 1494 of the second pocket 1450. In some embodiments, the second pocket length 1490 is between about 0.5 nm to about 10 nm.

Figure 15:
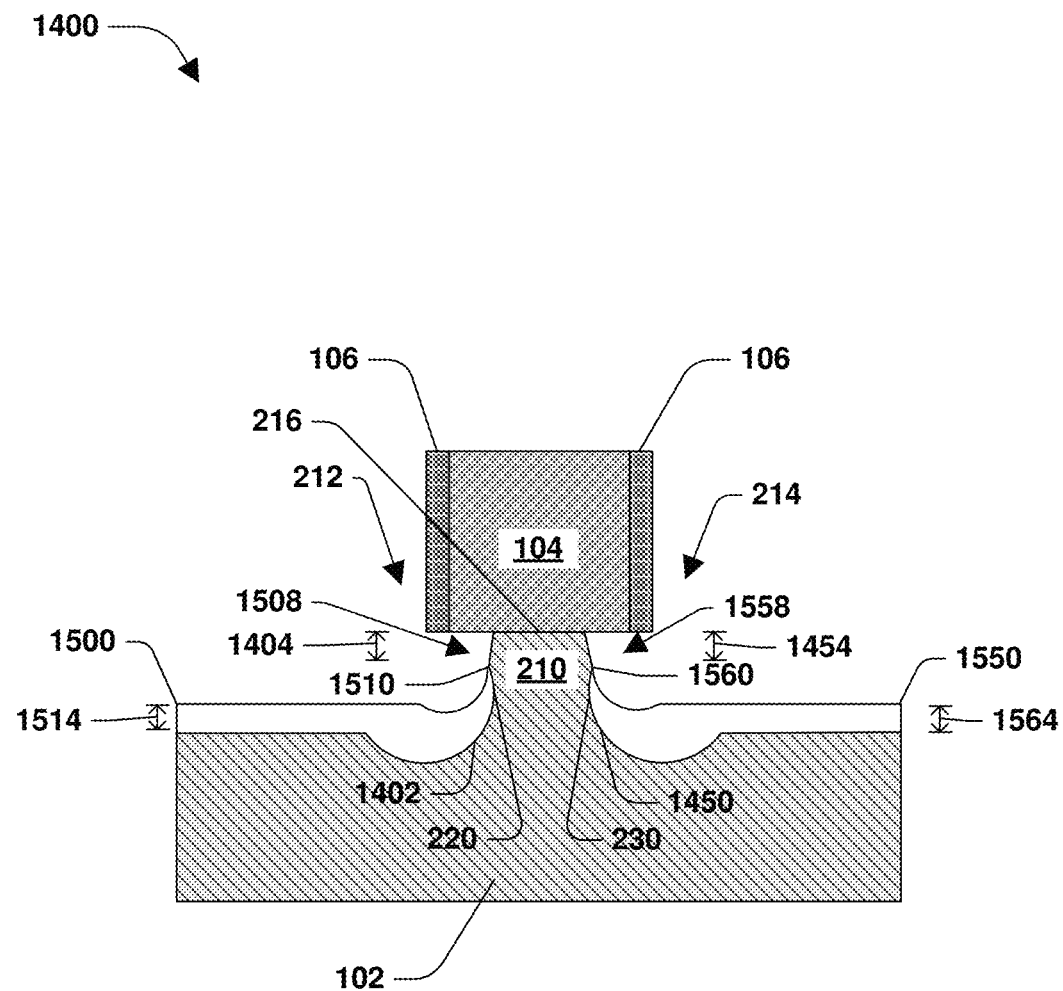
FIG. 15 illustrates forming a first type region and a second type region associated with forming a semiconductor device, according to an embodiment.

Turning to FIG. 15, in an embodiment, a first type region 1500 is formed over the substrate region 102 at least partially within the first recess 200 and first pocket 1402. In some embodiments, the first type region 1500 is disposed on the first side 212 of the channel region 210. The first type region 1500 is formed in any number of ways, such as by deposition, epitaxial growth, etc., for example. In some embodiments, the first type region 1500 is doped during the epitaxial growth process. In some embodiments, the first type region 1500 is doped after the epitaxial growth process. In some embodiments, the first type region 1500 is doped during and after the epitaxial growth process. In some embodiments, the first type region 1500 comprises the first conductivity type. In some embodiments, the first conductivity type of the first type region 1500 comprises a p-type material. In some embodiments, the first conductivity type of the first type region 1500 comprises an n-type material.

In an embodiment, the first type region 1500 is in contact with the first non-linear surface 220 of the channel region 210. In some embodiments, the first type region 1500 covers less than all of the first non-linear surface 220. In some embodiments, a first uncovered portion 1508 of the first non-linear surface 220 is not covered by the first type region 1500. According to some embodiments, a first type region end 1510 of the first type region 1500 is separated the first separating distance 1404 from the top surface 216 of the channel region 210. In some embodiments, the first type region 1500 comprises a first type region thickness 1514 between about 2 nm to about 5 nm.

In an embodiment, a second type region 1550 is formed over the substrate region 102 at least partially within the second recess 202 and second pocket 1450. In some embodiments, the second type region 1550 is disposed on the second side 214 of the channel region 210. The second type region 1550 is formed in any number of ways, such as by deposition, epitaxial growth, etc., for example. In some embodiments, the second type region 1550 is doped during the epitaxial growth process. In some embodiments, the second type region 1550 is doped after the epitaxial growth process. In some embodiments, the second type region 1550 is doped during and after the epitaxial growth process. In some embodiments, the second type region 1550 comprises the second conductivity type. In some embodiments, the second conductivity type of the second type region 1550 comprises a p-type material. In some embodiments, the second conductivity type of the second type region 1550 comprises an n-type material.

In an embodiment, the second type region 1550 is in contact with the second non-linear surface 230 of the channel region 210. In some embodiments, the second type region 1550 covers less than all of the second non-linear surface 230. In some embodiments, a second uncovered portion 1558 of the second non-linear surface 230 is not covered by the second type region 1550. According to some embodiments, a second type region end 1560 of the second type region 1550 is separated the second separating distance 1454 from the top surface 216 of the channel region 210. In some embodiments, the second type region 1550 comprises a second type region thickness 1564 between about 2 nm to about 5 nm.

Figure 16:
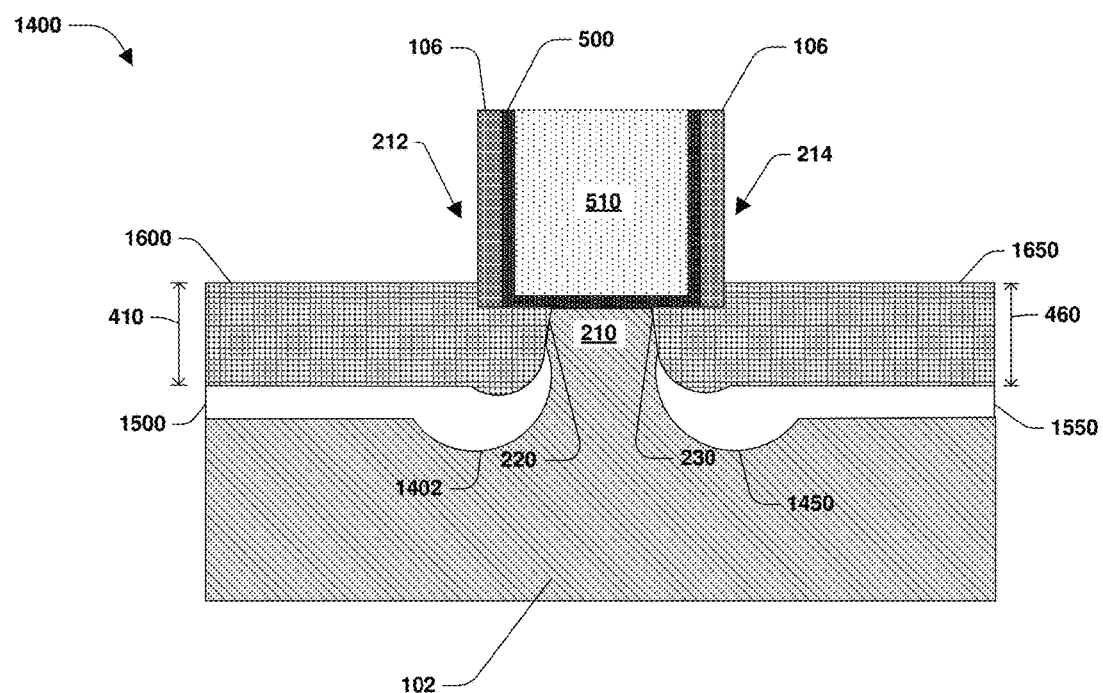
FIG. 16 illustrates a semiconductor device, according to an embodiment.

Turning to FIG. 16, in an embodiment, a third type region 1600 is formed covering the first type region 1500. In some embodiments, the third type region 1600 is disposed on the first side 212 of the channel region 210. The third type region 1600 is formed in any number of ways, such as by deposition, epitaxial growth, etc., for example. In some embodiments, the third type region 1600 is doped during the epitaxial growth process. In some embodiments, the third type region 1600 is doped after the epitaxial growth process. In some embodiments, the third type region 1600 is doped during and after the epitaxial growth process. In some embodiments, the third type region 1600 is in contact with the first non-linear surface 220 of the channel region 210. In some embodiments, the third type region 1600 comprises the third conductivity type. In some embodiments, the third conductivity type of the third type region 1600 comprises a p-type material. In some embodiments, the third conductivity type of the third type region 1600 comprises an n-type material. In an embodiment, the third type region 1600 comprises a source region. In an embodiment, the third type region 1600 comprises a drain region.

According to some embodiments, the third conductivity type of the third type region 1600 is opposite the first conductivity type of the first type region 1500. In some embodiments, the first conductivity type of the first type region 1500 comprises a p-type material and the third conductivity type of the third type region 1600 comprises an n-type material. In some embodiments, the first conductivity type of the first type region 1500 comprises an n-type material and the third conductivity type of the third type region 1600 comprises a p-type material. In some embodiments, the third type region 1600 comprises the third type region thickness 410 between about 5 nm to about 50 nm.

In an embodiment, a fourth type region 1650 is formed covering the second type region 1550. In some embodiments, the fourth type region 1650 is disposed on the second side 214 of the channel region 210 such that the channel region 210 extends between the third type region 1600 and the fourth type region 1650. The fourth type region 1650 is formed in any number of ways, such as by deposition, epitaxial growth, etc., for example. In some embodiments, the fourth type region 1650 is doped during the epitaxial growth process. In some embodiments, the fourth type region 1650 is doped after the epitaxial growth process. In some embodiments, the fourth type region 1650 is doped during and after the epitaxial growth process. In some embodiments, the fourth type region 1650 is in contact with the second non-linear surface 230 of the channel region 210. In some embodiments, the fourth type region 1650 comprises a fourth conductivity type. In some embodiments, the fourth conductivity type of the fourth type region 1650 comprises a p-type material. In some embodiments, the fourth conductivity type of the fourth type region 1650 comprises an n-type material. In an embodiment, the fourth type region 1650 comprises a source region. In an embodiment, the fourth type region 1650 comprises a drain region.

According to some embodiments, the fourth conductivity type of the fourth type region 1650 is opposite the second conductivity type of the second type region 1550. In some embodiments, the second conductivity type of the second type region 1550 comprises a p-type material and the fourth conductivity type of the fourth type region 1650 comprises an n-type material. In some embodiments, the second conductivity type of the second type region 1550 comprises an n-type material and the fourth conductivity type of the fourth type region 1650 comprises a p-type material. In some embodiments, the fourth type region 1650 comprises the fourth type region thickness 460 between about 5 nm to about 50 nm.

In an embodiment, the dummy gate 104 is removed, such as by etching. In some embodiments, the gate dielectric 500 is formed over the channel region 210 and portions of the third type region 400 and fourth type region 450. According to some embodiments, the gate electrode 510 is formed above the gate dielectric 500. In an embodiment, the gate electrode is disposed above the channel region 210 and portions of the third type region 1600 and fourth type region 1650. According to some embodiments, in a gate first process, the gate dielectric 500 and gate electrode 510 are formed first, followed by the formation of at least one of the channel region 210, first type region 1500, second type region 1550, third type region 1600, fourth type region 1650, etc.

According to some embodiments, the semiconductor device 100, 600, 1000, 1400 is counterdoped due to one of the first type region 300, 1002, 1500 having a different conductivity type than the third type region 400, 1600 or the second type region 350, 1050, 1550 having a different conductivity type than the fourth type region 450, 1650. In some embodiments, the semiconductor device 100, 600, 1000, 1400 exhibits improved tuning of a threshold voltage ($V_t$) as compared to non-counterdoped semiconductor devices. Additionally, in some embodiments, the semiconductor device 100, 600, 1000, 1400 has reduced leakage between a source and drain while exhibiting a current drive through the channel region 210 that is equal to or greater than a current drive in a non-counterdoped device.

Figure 17:
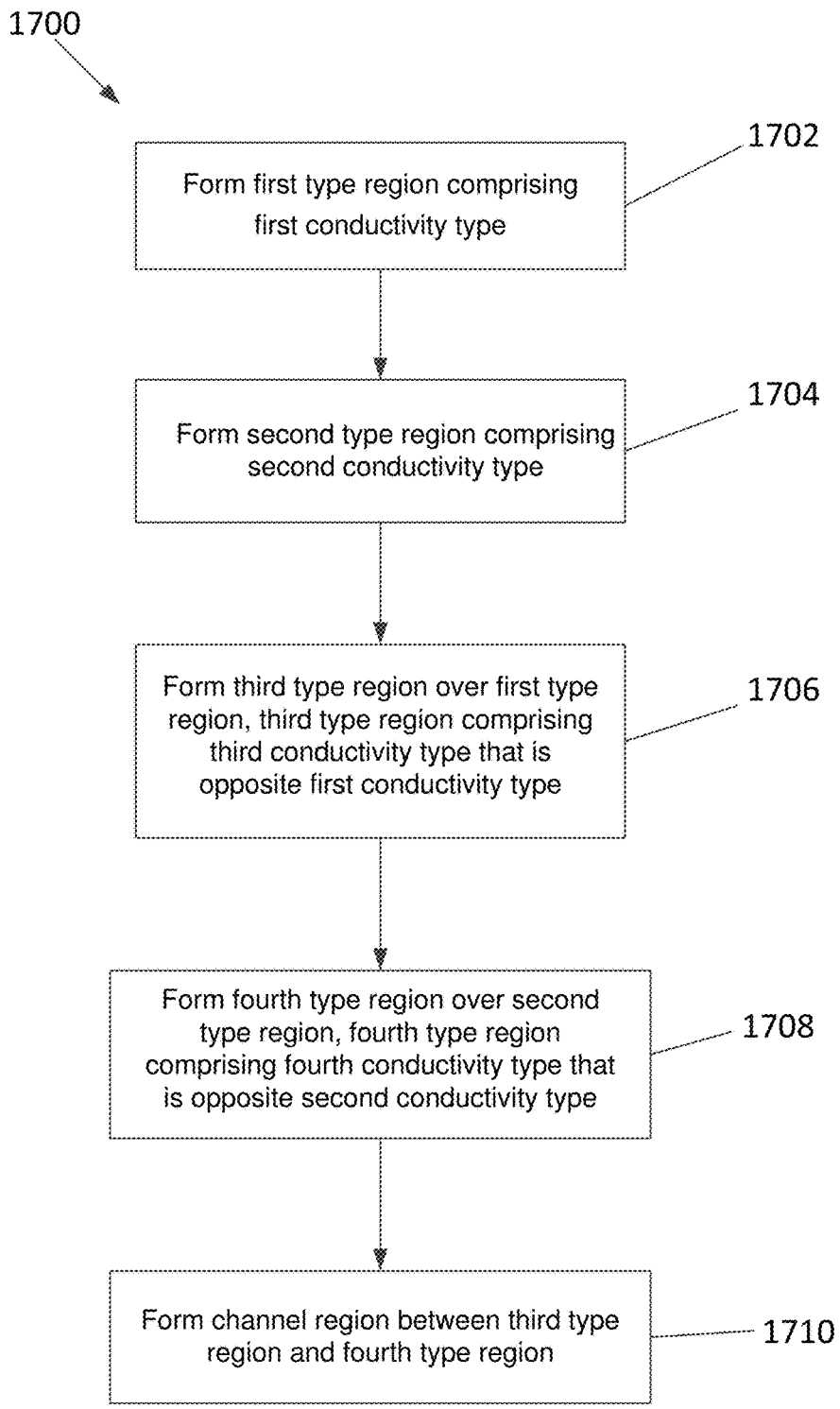
FIG. 17 illustrates a method of forming a semiconductor device, according to an embodiment.

An example method 1700 of forming a semiconductor device, such as semiconductor device 100, 600, 1000, 1400, according to some embodiments, is illustrated in FIG. 17. At 1702, the first type region 300, 1002, 1500 is formed comprising the first conductivity type. At 1704, the second type region 350, 1050, 1550 is formed comprising the second conductivity type. At 1706, the third type region 400, 1600 is formed over the first type region 300, 1002, 1500, the third type region 400, 1600 comprising the third conductivity type that is opposite the first conductivity type. At 1708, the fourth type region 450, 1650 is formed over the second type region 350, 1050, 1550, the fourth type region 450, 1650 comprising the fourth conductivity type that is opposite the second conductivity type. At 1710, the channel region 210 is formed between the third type region 400, 1600 and the fourth type region 450, 1650.

In an embodiment, a semiconductor device comprises a first type region comprising a first conductivity type and a second type region comprising a second conductivity type. In an embodiment, the semiconductor device comprises a third type region comprising a third conductivity type that is opposite the first conductivity type, the third type region covering the first type region. In an embodiment, the semiconductor device comprises a fourth type region comprising a fourth conductivity type that is opposite the second conductivity type, the fourth type region covering the second type region. In an embodiment, the semiconductor device comprises a channel region extending between the third type region and the fourth type region In an embodiment, a semiconductor device comprises a first type region comprising a first conductivity type and a second type region comprising a second conductivity type. In an embodiment, the semiconductor device comprises a third type region comprising a third conductivity type that is opposite the first conductivity type, the third type region covering the first type region. In an embodiment, the semiconductor device comprises a fourth type region comprising a fourth conductivity type that is opposite the second conductivity type, the fourth type region covering the second type region. In an embodiment, the semiconductor device comprises a channel region extending between the third type region and the fourth type region, the channel region defining a first non-linear surface on a first side of the channel region and a second non-linear surface on a second side of the channel region. In an embodiment, the first type region is in contact with the first non-linear surface and the second type region is in contact with the second non-linear surface.

In an embodiment, a method of forming a semiconductor device comprises forming a first type region comprising a first conductivity type. In an embodiment, the method comprises forming a second type region comprising a second conductivity type. In an embodiment, the method comprises forming a third type region over the first type region, the third type region comprising a third conductivity type that is opposite the first conductivity type. In an embodiment, the method comprises forming a fourth type region over the second type region, the fourth type region comprising a fourth conductivity type that is opposite the second conductivity type. In an embodiment, the method comprises forming a channel region between the third type region and the fourth type region.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first type region and a second type region generally correspond to first type region A and second type region B or two different or two identical type regions or the same type region.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
etching a substrate to define a channel region in the substrate between a first recess etched into the substrate and a second recess etched into the substrate, wherein the etching the substrate undercuts a dummy gate overlying the substrate to expose a portion of a bottom surface of the dummy gate;
growing a first epitaxial layer within the first recess;
doping the first epitaxial layer to form a first type epitaxial layer comprising a first conductivity type;
growing a second epitaxial layer within the second recess;
doping the second epitaxial layer to form a second type epitaxial layer comprising a second conductivity type;
etching a portion of the first epitaxial layer within the first recess and etching a portion of the second epitaxial layer within the second recess to re-expose a portion of a top surface of the substrate that defines the first recess and the second recess;
growing a third epitaxial layer within the first recess over the first type epitaxial layer after the etching the portion of the first epitaxial layer;
doping the third epitaxial layer to form a third type epitaxial layer comprising a third conductivity type that is opposite the first conductivity type;
growing a fourth epitaxial layer within the second recess over the second type epitaxial layer; and
doping the fourth epitaxial layer to form a fourth type epitaxial layer comprising a fourth conductivity type that is opposite the second conductivity type.

2. The method of claim 1, comprising:
forming the dummy gate and sidewall spacers prior to the etching the substrate.

3. The method of claim 2, wherein the etching the substrate etches a portion of the substrate under the dummy gate.

4. The method of claim 2, wherein the etching the substrate comprises etching the substrate until the first recess undercuts that dummy gate by about 2 nm to about 20 nm.

5. The method of claim 2, comprising replacing the dummy gate with a gate dielectric and a gate electrode after the growing the third epitaxial layer and the growing the fourth epitaxial layer.

6. The method of claim 1, wherein the growing the first epitaxial layer and the doping the first epitaxial layer occur concurrently.

7. The method of claim 1, comprising:
forming a sidewall spacer and the dummy gate prior to the etching the substrate and wherein the growing the third epitaxial layer comprises growing the third epitaxial layer to contact a sidewall of the sidewall spacer.

8. The method of claim 1, comprising:
forming the dummy gate and wherein the growing the first epitaxial layer comprises growing the first epitaxial layer until a top surface of the first epitaxial layer is in contact with the dummy gate.

9. The method of claim 1, wherein the etching the substrate comprises:
performing a first etch to define the first recess; and
performing a second etch, different than the first etch, to define a first pocket with the first recess.

10. The method of claim 9, wherein the second etch comprises a reactive ion etching process.

11. The method of claim 9, wherein the growing a first epitaxial layer comprises growing the first epitaxial layer within the first pocket.

12. A method, comprising:
etching a substrate to define a channel region in the substrate between a first recess etched into the substrate and a second recess etched into the substrate, wherein the etching the substrate undercuts a dummy gate overlying the substrate to expose a portion of a bottom surface of the dummy gate;
growing a first epitaxial layer within the first recess defined at least partially by a top surface of the substrate;
doping the first epitaxial layer to form a first type epitaxial layer comprising a first conductivity type;
etching a portion of the first epitaxial layer within the first recess to re-expose a portion of the top surface of the substrate that defines the first recess;
growing a second epitaxial layer within the first recess over the first type epitaxial layer after the etching the portion of the first epitaxial layer; and
doping the second epitaxial layer to form a second type epitaxial layer comprising a second conductivity type that is opposite the first conductivity type.

13. The method of claim 12, wherein the growing the first epitaxial layer and the doping the first epitaxial layer occur concurrently.

14. The method of claim 12, wherein the growing the second epitaxial layer comprises growing the second epitaxial layer to contact a portion of the channel region exposed above the first epitaxial layer and below the dummy gate.

15. The method of claim 12, wherein the growing the second epitaxial layer comprises growing the second epitaxial layer over the portion of the top surface of the substrate re-exposed upon the etching the portion of the first epitaxial layer.

16. The method of claim 12, comprising:
forming a sidewall spacer and the dummy gate prior to the etching the substrate and wherein the growing the second epitaxial layer comprises growing the second epitaxial layer to contact a sidewall of the sidewall spacer.

17. The method of claim 12, comprising:
forming the dummy gate and wherein the growing the epitaxial layer comprises growing the first epitaxial layer until a top surface of the first epitaxial layer is in contact with the dummy gate.

* * * * *